(12) United States Patent
McBride

(10) Patent No.: US 6,550,041 B1
(45) Date of Patent: Apr. 15, 2003

(54) METHOD AND APPARATUS FOR EVALUATING THE DESIGN QUALITY OF NETWORK NODES

(75) Inventor: John G McBride, Ft Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 09/274,162

(22) Filed: Mar. 22, 1999

(51) Int. Cl.$^7$ ................................................ G06F 17/50
(52) U.S. Cl. ................ 716/5; 716/10; 716/11; 716/12; 716/13
(58) Field of Search ................ 716/5, 11, 12, 716/6, 8

(56) References Cited

U.S. PATENT DOCUMENTS

| | | | |
|---|---|---|---|
| 5,828,580 A | * 10/1998 | Ho | 716/12 |
| 5,999,726 A | * 12/1999 | Ho | 716/11 |
| 6,138,267 A | * 10/2000 | Murai | 716/5 |

* cited by examiner

Primary Examiner—Vuthe Siek
Assistant Examiner—Helen Rossoshek

(57) ABSTRACT

A method and apparatus for evaluating an integrated circuit design to determine the effective wire resistance at a receiver node of a receiver gate disposed in a network in the integrated circuit. The rules checker apparatus comprises a computer capable of being configured to execute a rules checker program which analyzes information relating to the integrated circuit to calculate the effective wire resistance at the receiver node. The rules checker of the present invention traverses a path from the output node of the driver gate to the receiver node of the receiver gate and recursively sums the values of the parasitic resistances encountered along the path to maintain a total resistance value. Once the rules checker determines that the receiver node has been reached, the rules checker determines that the total resistance value equals the effective wire resistance at the receiver node. The rules checker also is capable of determining whether or not a path being traversed is a false path, i.e., a path that does not lead to the receiver node. When the rules checker determines that a path being traversed does not lead to the receiver node, the total resistance value is set to 0 so that the parasitic resistances along a false path are not taken into account in calculating the effective wire resistance at the receiver node.

21 Claims, 8 Drawing Sheets

METHOD AND APPARATUS FOR EVALUATING THE DESIGN QUALITY OF NETWORK NODES

TECHNICAL FIELD OF THE INVENTION

The present invention generally relates to computer-aided circuit design systems and, more particularly, to a method and apparatus for evaluating the design quality of a network of nodes in an integrated circuit to determine the effective wire resistance at a receiver node of the network.

BACKGROUND OF THE INVENTION

Integrated circuits are electrical circuits comprised of transistors, resistors, capacitors, and other components comprised on a single semiconductor "chip" in which the components are interconnected to perform a given function. Typical examples of integrated circuits include, for example, microprocessors, programmable logic devices (PLDs), electrically erasable programmable memory devices (EEPROMs), random access memory devices (RAMs), operational amplifiers and voltage regulators. A circuit designer typically designs the integrated circuit by using very large scale integrated (VLSI) circuit design techniques to create a circuit schematic which indicates the electrical components and their interconnections. Often, designs are simulated by computer to verify functionality and to ensure that performance goals are satisfied.

In the world of electrical device engineering, the design and analysis work involved in producing electronic devices is often performed using electronic computer aided design (E-CAD) tools. As will be appreciated by those skilled in the art, electronic devices include electrical analog, digital, mixed hardware, optical, electro-mechanical, and a variety of other electrical devices. The design and the subsequent simulation of any circuit board, VLSI chip, or other electrical device via E-CAD tools allows a product to be thoroughly tested and often eliminates the need for building a prototype. Thus, today's sophisticated E-CAD tools may enable the circuit manufacturer to go directly to the manufacturing stage without having to perform costly, time consuming prototyping.

In order to perform the simulation and analysis of a hardware device, E-CAD tools must deal with an electronic representation of the hardware device. A "netlist" is one common representation of a hardware device. As will be appreciated by those skilled in the art of hardware device design, a "netlist" is a detailed circuit specification used by logic synthesizers, circuit simulators and other circuit design optimization tools. A netlist typically comprises a list of circuit components and the interconnections between those components.

The two forms of a netlist are the flat netlist and the hierarchical netlist. Often, a netlist will contain a number of circuit "modules" which are used repetitively throughout the larger circuit. A flat netlist will contain multiple copies of the circuit modules essentially containing no boundary differentiation between the circuit modules and other components in the device. By way of analogy, one graphical representation of a flat netlist is simply the complete schematic of the circuit device.

In contrast, a hierarchical netlist will only maintain one copy of a circuit module which may be used in multiple locations. By way of analogy, one graphical representation of a hierarchical netlist would show the basic and/or non-repetitive devices in schematic form and the more complex and/or repetitive circuit modules would be represented by "black boxes." As will be appreciated by those skilled in the art, a black box is a system or component whose inputs, outputs, and general function are known, but whose contents are not shown. These "black box" representations, hereinafter called "modules", will mask the complexities therein, typically showing only input/output ports.

An integrated circuit design can be represented at different levels of abstraction, such as the Register-Transfer level (RTL) and the logic level, using a hardware description language (HDL). VHDL and Verilog are examples of HDL languages. At any abstraction level, an integrated circuit design is specified using behavioral or structural descriptions, or a mix of both. At the logical level, the behavioral description is specified using boolean equations. The structural description is represented as a netlist of primitive cells. Examples of primitive cells are fill-adders, NAND gates, latches, and D-Flip Flops.

Having set forth some very basic information regarding the representation of integrated circuits and other circuit schematics through netlists, systems are presently known that use the information provided in netlists to evaluate circuit timing and other related parameters. More specifically, systems are known that perform a timing analysis of circuits using netlist files. Although the operational specifics may vary from system to system, generally such systems identify certain critical timing paths, and then evaluate the circuit to determine whether timing violations may occur through the critical paths. As is known, timing specifications may be provided to such systems by way of a configuration file.

One such system known in the prior art is marketed under the name PathMill, by EPIC Design Technology, Inc., subsequently purchased by Synopsis, Inc. PathMill is a transistor-based analysis tool used to find critical paths and to verify timing in semiconductor designs. Using static and mixed-level timing analysis, PathMill processes transistors, gates, and timing models. It also calculates timing delays, performs path searches, and checks timing requirements. As is known, PathMill can analyze combinational designs containing gates, and sequential designs containing gates, latches, flip-flops, and clocks. Combinational designs are generally measured through the longest and shortest paths.

While tools such as these are useful for the design verification process after layout, there are various shortcomings in the PathMill product and other similar products. One primary shortcoming of the PathMill program is that it does not analyze the circuits to determine the design quality of the circuits. Rather, PathMill performs a static timing analysis of a circuit using the netlist provided to PathMill. Furthermore, configuring PathMill to recognize various circuit characteristics is typically a very difficult task.

Accordingly, a need exists for a rules checking system that will allow circuits to be evaluated for design quality. The present invention works in conjunction with a tool, such as, for example, PathMill, to build a database which is then utilized by the rules checking system of the present invention to evaluate the design quality of network nodes. Typically, such tools, including PathMill, receive a netlist and use the netlist to determine FET (field effect transistor) direction, node types, latches, dynamic gates, rise and fall times, etc. This information is utilized by the present invention to build a database which is then utilized by the rules checking system of the present invention to evaluate the design quality of network nodes, preferably of network nodes of FET-level circuits designed in accordance with VLSI techniques.

In accordance with the present invention, the rules checking system evaluates a network of nodes to determine the effective wire resistance of the network, which is derived from parasitic wire resistances within the network. The parasitic wire resistances result from the conductors that are instantiated in the integrated circuit to create the interconnects between the FETs. The effective wire resistance at a node is needed in order to calculate the cross-capacitance noise at the node.

Integrated circuits can be viewed as a plurality of drivers and receivers with parasitic wire resistances disposed between them. A driver is a gate comprised of a plurality of FETs which drives another gate which is also comprised of a plurality of FETs. The gate being driven is commonly referred to as the receiver. The driver and receiver gates may be, for example, inverters. A receiver node is the node at the input of a receiver. Each conductor that interconnects the output of a driver to the input of a receiver has an individual parasitic resistance associated with it.

The individual parasitic wire resistances between physical nodes may be obtained by an RC extraction program. RC extraction programs are well known in the art and are currently available on the market. The individual parasitic wire resistances may be passed to a timing analyzer program such as Pathmill in the form of a netlist. The timing analyzer program may utilize this information to perform certain types of analyses.

Conventional circuit analysis techniques can be used to calculate the effective wire resistance attributable to the individual parasitic wire resistances. Another technique that can be used to calculate the effective wire resistance of a circuit is to simulate the FETs of the drivers and receivers and then simulate the operation of the circuit using a program such as Spice to calculate the effective wire resistance at the receiver node. One disadvantage of these approaches is that the strengths of the FETs must be determined in order for the effective wire resistance to be determined, which can be a difficult task. It would be advantageous to provide a system for determining the effective wire resistance at a receiver node in an integrated circuit which does not require the calculation of the individual strengths of the FETs of the circuit.

Accordingly, a need exists for a rules checking system which will calculate the effective wire resistance of a receiver node in an integrated circuit and which does not require that the strengths of the FETs of the network be calculated.

SUMMARY OF THE INVENTION

The present invention provides a method and apparatus for evaluating an integrated circuit design to determine the effective wire resistance at a receiver node of a receiver gate disposed in a network of the integrated circuit. The rules checker apparatus comprises a computer capable of being configured to execute a rules checker program which analyzes information relating to the integrated circuit to calculate the effective wire resistance at the receiver node. The rules checker of the present invention traverses a path from the output node of a driver gate to the receiver node of the receiver gate and recursively sums the values of the parasitic resistances encountered along the path to maintain a total resistance value. Once the rules checker determines that the receiver node has been reached, the rules checker determines that the total resistance value equals the effective wire resistance at the receiver node.

In accordance with the preferred embodiment of the present invention, the rules checker also is capable of determining whether or not a path being traversed is a false path, i.e., a path that does not lead to the receiver node. When the rules checker determines that a path being traversed does not lead to the receiver node, the total resistance value is set to 0 so that the parasitic resistances along the false path are not taken into account in calculating the effective wire resistance at the receiver node.

When traversing a path, the rules checker processes each node of the network and identifies parasitic resistances connected to the nodes. When the rules checker encounters a parasitic resistance connected to a node, the rules checker determines whether or not the encountered parasitic resistance has previously been marked. If the rules checker determines that the encountered parasitic resistance has not previously been marked, the rules checker marks the encountered parasitic resistance and the node being processed. The rules checker then adds the value of the encountered parasitic resistance to a value of a TOTAL RESISTANCE variable. When the rules checker reaches the receiver node, it determines that the value of the TOTAL RESISTANCE variable is equal to the effective wire resistance at the receiver node.

Other features and advantages of the present invention will become apparent from the following description, drawings and claims.

DETAILED DESCRIPTION OF THE INVENTION

Figure 1:
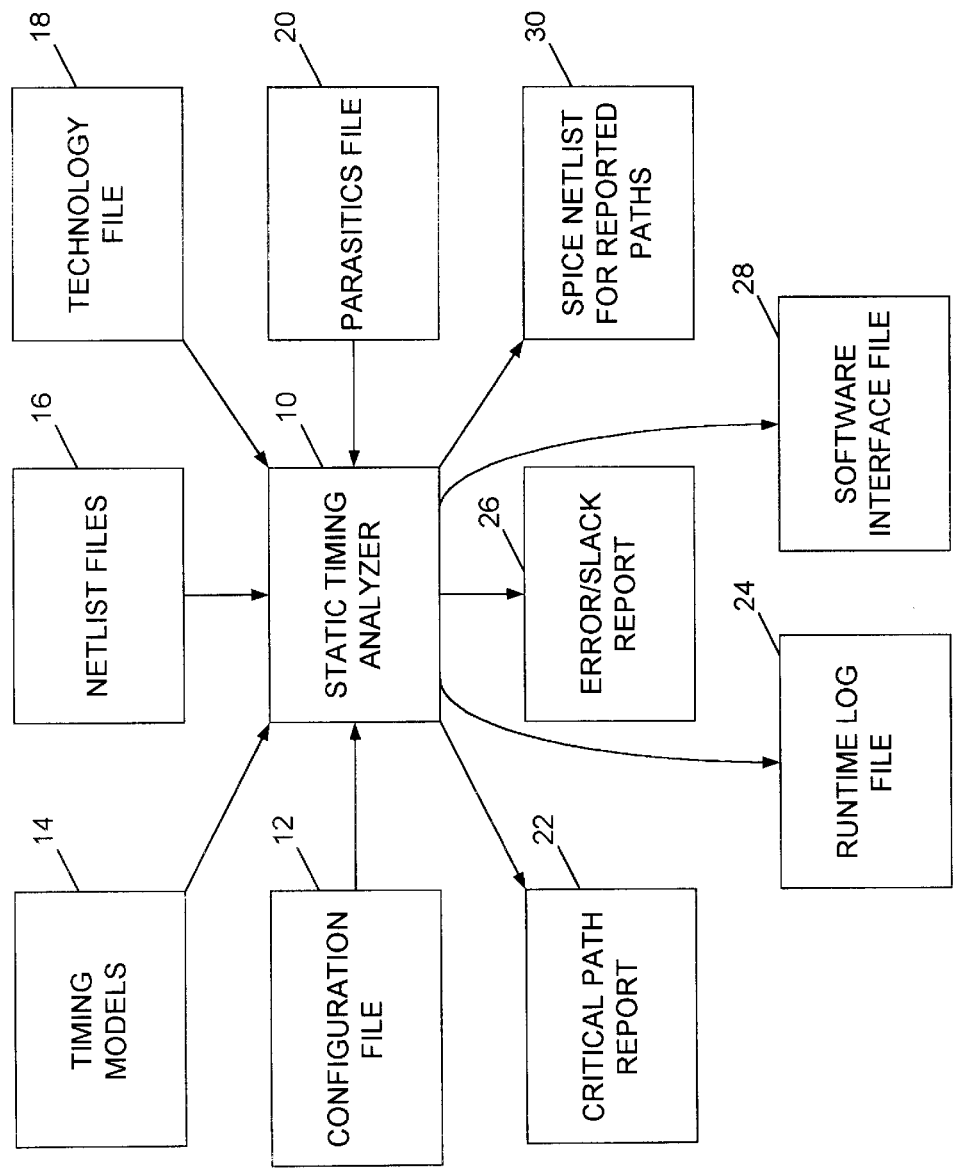
FIG. 1 is a block diagram of a static timing analyzer system, which is known in the prior art.

Having summarized various aspects of the present invention, reference will now be made in detail to the description of the invention as illustrated in the drawings. While the invention will be described in connection with these drawings, there is no intent to limit it to the embodiment or embodiments disclosed therein. On the contrary, the intent is to cover all alternatives, modifications and equivalents included within the spirit and scope of the invention as defined by the appended claims.

Referring now to the drawings, reference is made to FIG. 1, which is a block diagram of a prior art static timing analyzer program that illustrates the basic informational flow in such a system. Specifically, and as previously mentioned, one such system is marketed under the name PathMill. FIG. 1 is a diagram that illustrates the informational flow in the PathMill system. At the center of the diagram is a block denoted as static timing analyzer 10, which represents the PathMill program. Surrounding this block 10 are a number of other blocks that represent various input and output files and/or information.

More particularly, the PathMill program may utilize a configuration file 12, a file of timing models 14, one or more netlist files 16, a technology file 18, and a parasitic file 20, for various input information. In addition, the PathMill program may generate a number of different output files or other output information, including a critical path report 22, a runtime log file 24, an error report 26, a software interface file 28, and a SPICE netlist 30. When started, the PathMill program first processes the input netlist file(s) 16, the technology file 18, and the configuration file(s) 12. The information from these files is subsequently used for performing path analyses. Since the PathMill program is publicly available and marketed, its function and operation are well known, and therefore need not be discussed in detail herein.

For purposes of illustrating the present invention, much of the diagram and information illustrated in FIG. 1 is not shown in connection with the inventive system. In this regard, reference is made to FIG. 2, which shows one embodiment of a system constructed in accordance with the present invention. In the illustrated embodiment, only the static timing analyzer 10, the configuration file 12 and the netlist file 16 of FIG. 1 are shown. The configuration file(s) 12 contains information that informs the static timing analyzer 10 how to perform its analysis, and various numbers of configuration files may be used. The netlist file 16, as is known, defines the various integrated circuit components, and their interrelations.

Figure 2:
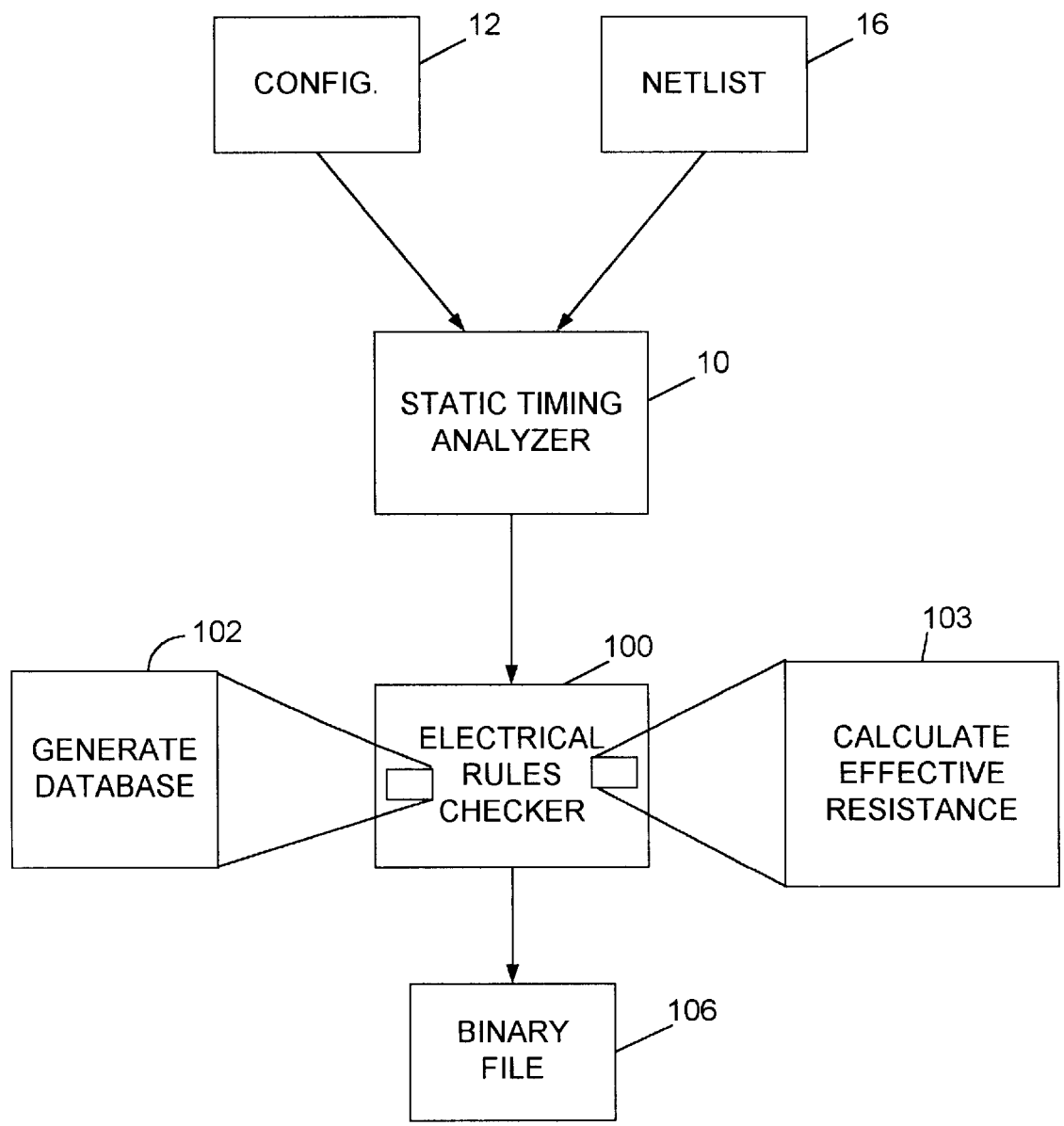
FIG. 2 is a block diagram illustrating the orientation of the electrical rules checker of the present invention in relation to an existing static timing analyzer.

The system shown in FIG. 2 preferably utilizes a computer (not shown) for its operation which runs the static timing analyzer program 10 and the electrical rules checker program 100. The computer may be electrically coupled to a memory device (not shown) which functions as a system storage unit for storing the code and data utilized and/or generated by the system. Those skilled in the art will realize that the present invention is not limited to any particular type of computer or memory device for performing these functions.

It should also be noted that the term "computer", as that term is used herein, is intended to denote any machine capable of performing the calculations, or computations, necessary to perform the tasks of the present invention. In essence, this includes any machine that is capable of accepting a structured input and of processing the input in accordance with prescribed rules to produce an output. Furthermore, those skilled in the art will understand that the system shown in FIG. 2 may be implemented in hardware, software, or a combination of both, and is not limited to any particular physical, structural, or electrical configuration.

The electrical rules checker 100 program of the present invention is preferably configured to operate on an output of the static timing analyzer 10. In this regard, the static timing analyzer may be configured to generate an output netlist database, which the electrical rules checker 100 of the present invention utilizes as an input. As previously mentioned, there are a wide variety of reasons why an electrical rules checking program may be desired. One such reason is to perform various checks over certain rules or strategies in an integrated circuit design. Such rules may vary from circuit to circuit, depending upon the particular application. For example, a portion of the electrical rules checker program 100 may operate to identify NOR gates and NAND gates within an integrated circuit design. This is only one example of the multitude of checks which may be performed by the electrical rules checker program 100 of the present invention.

As is known, a large scale integrated circuit design is often done at the FET level. A designer may utilize thousands of interconnected FETs in designing a portion of an integrated circuit. Although the designer may make every effort to follow certain design guidelines, mistakes may nevertheless be made. Accordingly, the electrical rules checker 100 of the present invention provides an excellent mechanism for double-checking designs and design layouts. Furthermore, the electrical rules checker 100 of the present invention may generate an output binary file 106, which may ultimately be used in subsequent executions of the electrical rules checker 100.

Prior to the electrical rules checker 100 of the present invention performing any of the rules checking tasks, a database of nodes and elements of the circuit to be evaluated is generated. This database is then utilized by the electrical rules checker 100 of the present invention to perform the rules checking tasks. The manner in which this database is generated will now be discussed below with respect to FIGS. 3A–3C. For purposes of illustration, it will be assumed that the static timing analyzer 10, shown in FIG. 2 and discussed above, is the PathMill static timing analyzer, in order to provide an example of one possible implementation of the present invention. However, those skilled in the art will understand that the electrical rules checker 100 of the present invention and the database of the present invention are not limited to use with any particular program. It should also be noted that it is not necessary for a database to be created in order to enable the electrical rules checker 100 to perform the rules checking tasks. A database preferably is generated so that the number of calls that the electrical rules checker 100 makes to the timing analyzer 10 is reduced or eliminated during the evaluation of a particular circuit.

The PathMill static timing analyzer provides an application program interface (API) which allows the PathMill static timing analyzer to communicate with the electrical rules checker 100 of the present invention. This API allows code external to the PathMill program to be linked to the PathMill program so that the external code and the PathMill program itself comprise one executable which can be run as a single program. The electrical rules checker 100 of the present invention utilizes this API to obtain information from the PathMill static timing analyzer which can be utilized by the electrical rules checker 100 to generate the database of the present invention, as represented by block 102. The electrical rules checker may then utilize this database in performing the task of calculating the effective wire resistance at a receiver node of a receiver gate of the integrated circuit, as represented by block 103.

Prior to the database being generated, the PathMill program runs and identifies circuit characteristics of the circuit under consideration such as, for example, FET direction, node types, latches, dynamic gates, clocks, rise and fall times, etc. Before the PathMill program terminates, it calls the electrical rules checker 100 of the present invention. The PathMill program has a feature commonly referred to as "hooks", which allows the PathMill program to call routines at various stages of execution. Once the PathMill program has finished identifying the characteristics mentioned above, the PathMill program calls the electrical rules checker 100 of the present invention. The electrical rules checker 100 of the present invention, through this series of subroutine calls, creates its own database of the circuit under consideration.

Figure 3A:
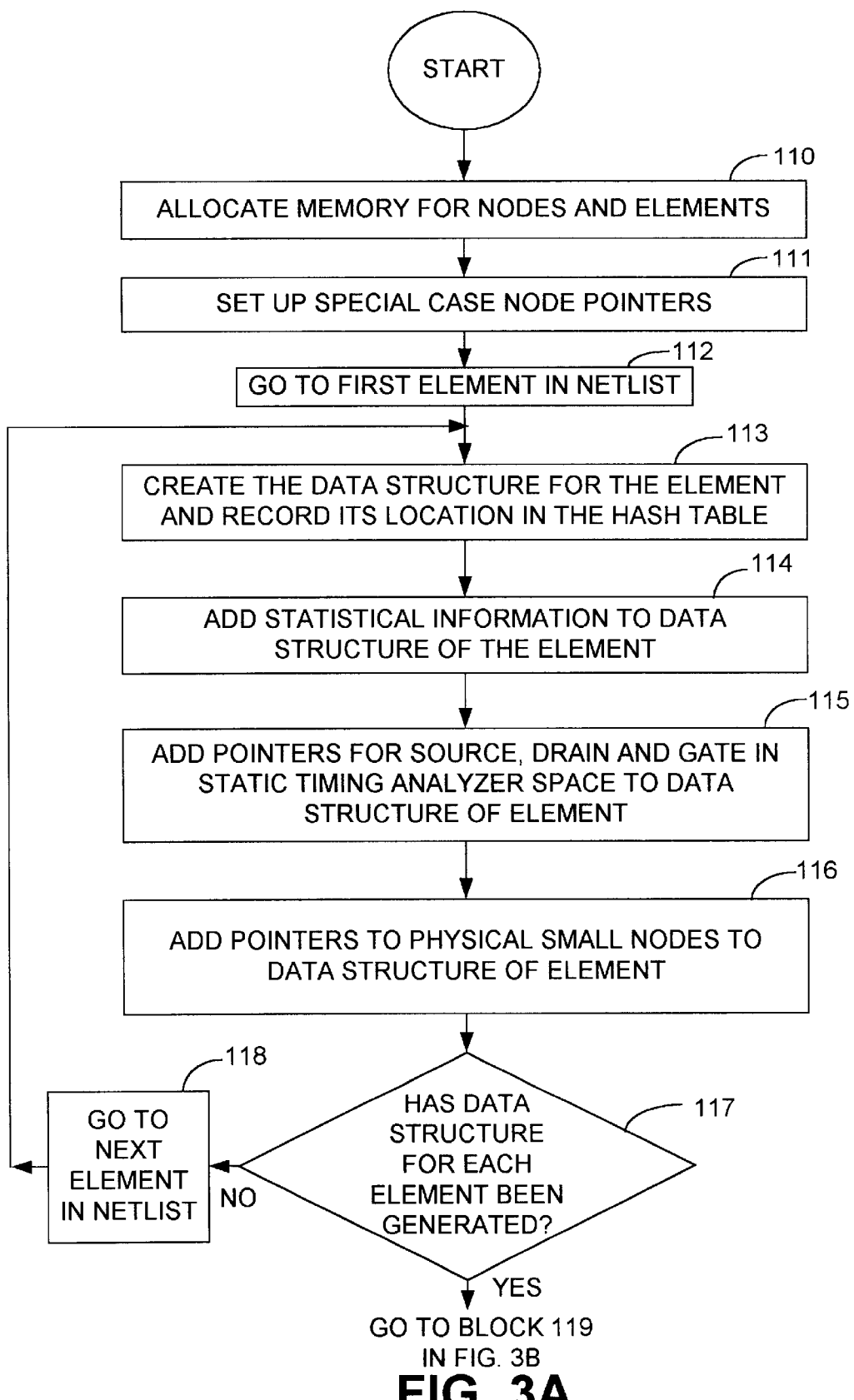
FIGS. 3A–3C together form a flow chart which illustrates the method of the present invention for generating the database of the present invention which can be utilized by the electrical rules checker of the present invention shown in FIG. 2 to perform rules checking tasks.
Figure 3B:
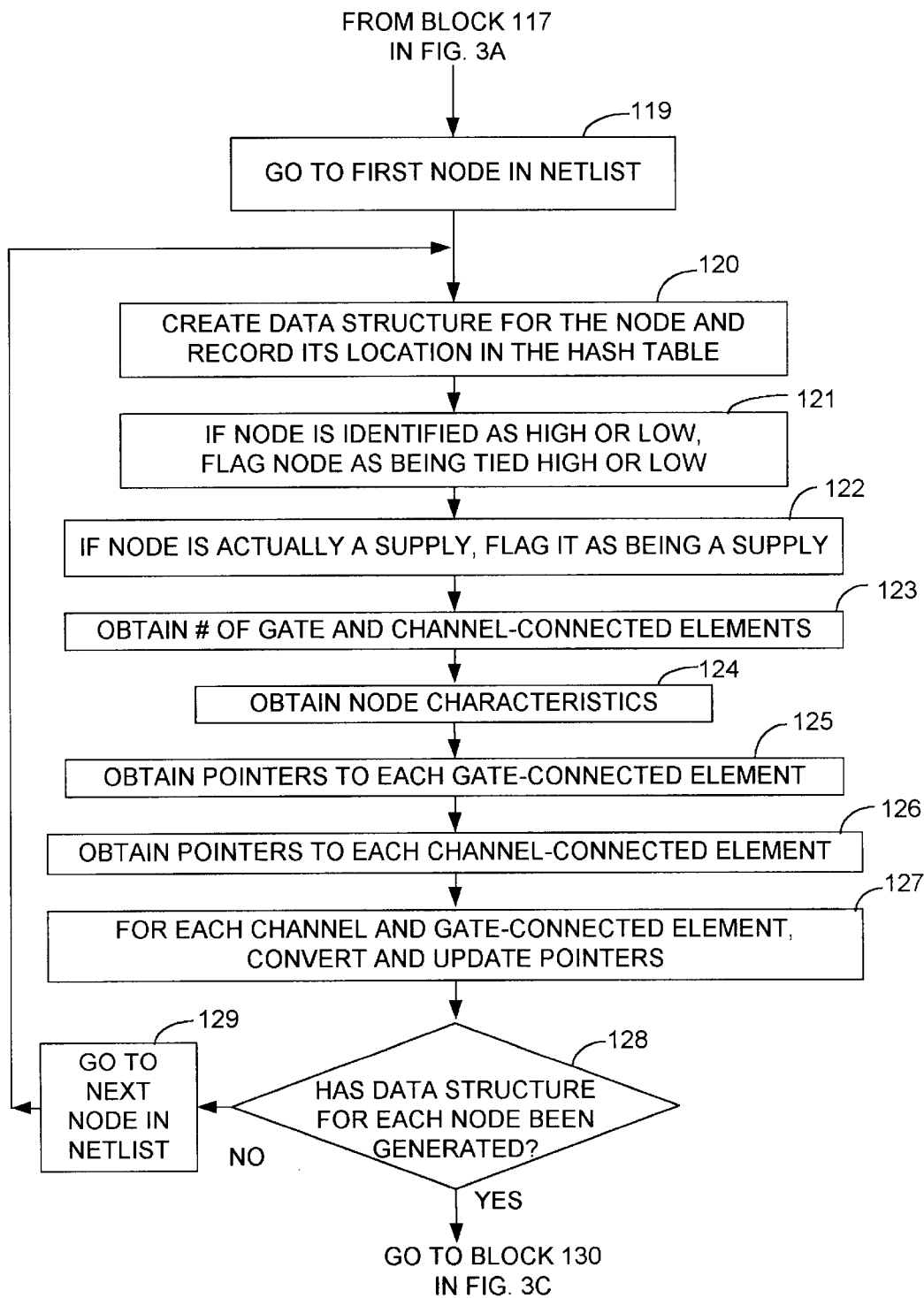

The first step in the process of generating the database is to allocate memory for the nodes and elements of the circuit, as indicated by block 110 in FIG. 3A. The PathMill program provides information via its API about the number of elements and nodes in the circuit of the electrical rules checker 100 and this information is utilized by the electrical rules checker 100 to perform memory allocation. Certain types of nodes and elements do not require as much information about their characteristics as do other types of nodes and elements. Therefore, the amount of memory allocated may vary for different types of nodes and elements. Rather than merely basing memory allocation on the number of nodes and elements in the circuit, it may be desirable to distinguish between different types of nodes and elements so that memory can be more efficiently allocated.

Once memory has been allocated for the nodes and elements, the next step in the process of the present invention is to set up node pointers for special cases of nodes, as indicated by block 111. These special types of nodes will be used repeatedly during the process of generating the database, as discussed below in more detail. Therefore, the pointers for these nodes preferably are set up relatively early in the database generation process. For example, nodes which correspond to the supplies (GND and VDD) are special types of nodes and it is helpful to set up node pointers for these types of nodes. This is done by finding the nodes whose names match the known names of the supply nodes.

For each element, a data structure must be generated which can be utilized by the electrical rules checker 100 in performing the rules checking tasks. Steps 113—116 in FIG. 3A correspond to the steps for creating the element data structures. The first element for which a data structure must be generated is obtained during the step represented by block 112. The data structure for that element is then generated and the location of the data structure is recorded in a hash table, as indicated by block 113. This step is performed so that the element pointers into the space of the static timing analyzer can be used later to look up the element data structures in the space of the electrical rules checker 100. Hash tables and the manner in which they are utilized are well-known in the art. Therefore, a detailed discussion of the manner in which the pointers into the space of the static timing analyzer are converted using the hash table into pointers into the space of the electrical rules checker 100 will not be provided herein since persons skilled in the art will understand the manner in which this can be accomplished.

Statistical information relating to the element is then added to the data structure of the element, as indicated by block 114. This information includes, for example, the width of the element, the length of the element, the direction of the element, and the element type. Once the statistical information has been included in the data structure of the element, the pointers for the source, drain and gate of the element, as defined in the space of the static timing analyzer, are included in the data structure of the element, as indicated by block 115. The pointers that were set up in step 111 are utilized in step 115. If either the source, drain or gate of the element is attached to ground or VDD, then the pointers for the source, drain and gate are set to the pointers for ground or VDD obtained in step 111.

A circuit and the nodes of the circuit can be represented logically or physically, or as a combination of both. A logical representation of a circuit primarily comprises FETs and does not include any resistors for representing parasitic resistance of the interconnect material. The logical representation of a node is identified in the PathMill program as a "supernode". On the other hand, a physical representation of a node, which is identified in the PathMill program as a "small node", includes FETs, but also includes resistors, which correspond to the parasitic resistance in the node. Therefore, in the physical representation, a small node exists between the resistors representing the parasitic resistance and between any FET and any one of the resistors. In the physical representation, FETs may be connected to different small nodes whereas in the logical representation, those same FETs may be connected to the same supernode.

Each element has a pointer to a supernode and to a small node for each drain, source and gate. Therefore, there are six pointers for each FET. Each small node in the physical representation maps to one particular supernode in the logical representation. In block 116, the pointers corresponding to these small nodes are added to the data structure of the element. A determination is then made at block 117 as to whether or not data structures for all of the elements have been generated. If not, the next element in the netlist is obtained, as indicated by block 118, and the process returns to block 113. If so, the process proceeds to block 119 in FIG. 3B.

Once the data structures for the elements have been generated, the data structures for the nodes must be generated. Blocks 120–127 in FIG. 3B correspond to the steps in the process of the present invention for generating the data structures of the nodes. The first node for which the data structure is to be generated is obtained at the step represented by block 119. The data structure for the node is then generated and the location of the data structure is recorded in the hash table, as indicated by block 120.

For the purpose of design quality analysis, it is important to distinguish actual supply nodes, such as VDD and GND, from other circuit nodes which have been declared to be tied high or low for the purpose of timing or other analysis. In block 121, the rules checker 100 determines, through the use of PathMill API calls, which nodes have been declared to be tied high or low, or are actually high or low because they are actual supply nodes. The rules checker 100 flags the actual high nodes as high and the actual low nodes as low in the step represented by block 121. In the step represented by block 122, the nodes which are actually supplies are flagged as supplies in the database.

The electrical rules checker 100 then obtains the number of gate-connected elements and the number of channel-connected elements from the static timing analyzer, as indicated by block 123. The electrical rules checker 100 also obtains the characteristics of the nodes from the static timing analyzer 10, as indicated by block 124. These characteristics include, for example, capacitance, node type, rise and fall time, etc. Once the characteristics of the node have been obtained, the electrical rules checker 100 obtains the pointers provided by the static timing analyzer 10 that point to each gate-connected element, as indicated by block 125. The electrical rules checker 100 then obtains the pointers from the static timing analyzer which point to each channel-connected element, as indicated by block 126.

The element pointers that are stored in the node during the steps represented by blocks 125 and 126 are pointers into the space of the static timing analyzer. Similarly, the node pointers that are stored in the element during the step represented by block 115 are pointers into the space of the static timing analyzer, except that the pointers to the VDD and GND nodes are stored as pointers to the VDD and GND nodes in the space of the electrical rules checker 100. In the step represented by block 127, some of these pointers are converted to point to the elements and nodes in the space of the electrical rules checker 100. For each of the gate-connected and channel-connected elements of the current node, the following steps are performed, which are represented by block 127:

(1) the element pointer is converted to the corresponding element pointer into the space of the electrical rules checker 100 by looking it up in the hash table. This element pointer replaces the original element pointer in the node structure;

(2) the source, gate, and drain pointers in the element data structure are each checked to see if they point to the current node. If so, the node pointer (into the space of the static timing analyzer) is replaced with the pointer to the current node in the space of the electrical rules checker.

A determination is then made at block 128 as to whether or not data structures for all of the nodes have been generated. If not, the next node in the netlist is obtained, as indicated by block 129, and the process returns to block 120.

Figure 3C:
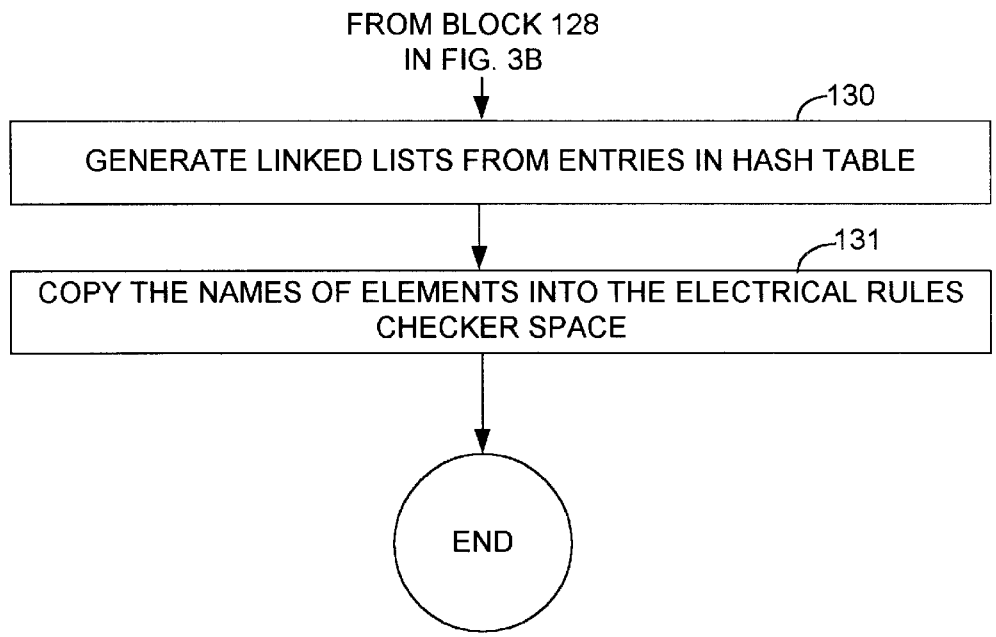

In order to enable the electrical rules checker 100 to maximize efficiency in searching the database of the present invention, once the data structures for all of the nodes have been created, linked lists of elements and nodes are generated from the entries in the hash table, as indicated by block 130 in FIG. 3C. These lists are used by the electrical rules checker 100 of the present invention is searching for an element in the database of the present invention. When searching for an element, the electrical rules checker 100 simply analyzes the elements contained in the linked list.

It should be noted that the arrangement of the elements and nodes in the linked lists may or may not have any physical relationship to the arrangement of the elements and nodes in the circuit under consideration. Thus, the linked lists are merely used to search through the elements and nodes stored in the database.

Once the linked lists have been generated, the names of the elements and nodes contained in the linked list are copied into electrical rules checker space, as indicated by block 131. This reduces the number of calls that need to be made to the PathMill program by the electrical rules checker 100. Once the database has been generated, no more calls have to be made to the PathMill program via the PathMill API. The database is comprised as the binary file 106 shown in FIG. 2.

Once the database has been generated in the manner described above, the electrical rules checker 100 of the present invention utilizes this database to perform the rules checking tasks. In accordance with the present invention, the electrical rules checker 100 evaluates a circuit to determine the effective wire resistance at a receiver node of the circuit. This task is represented by block 103 in FIG. 2. The electrical rules checker 100 of the present invention receives the netlist 16 passed to the Pathmill program and utilizes the netlist 16 and the database of the present invention to determine the effective wire resistance of a network of nodes contained in the integrated circuit. A detailed discussion of the method for determining the effective wire resistance will be discussed below in detail with reference to the flow charts of FIGS. 5 and 6.

Figure 4:
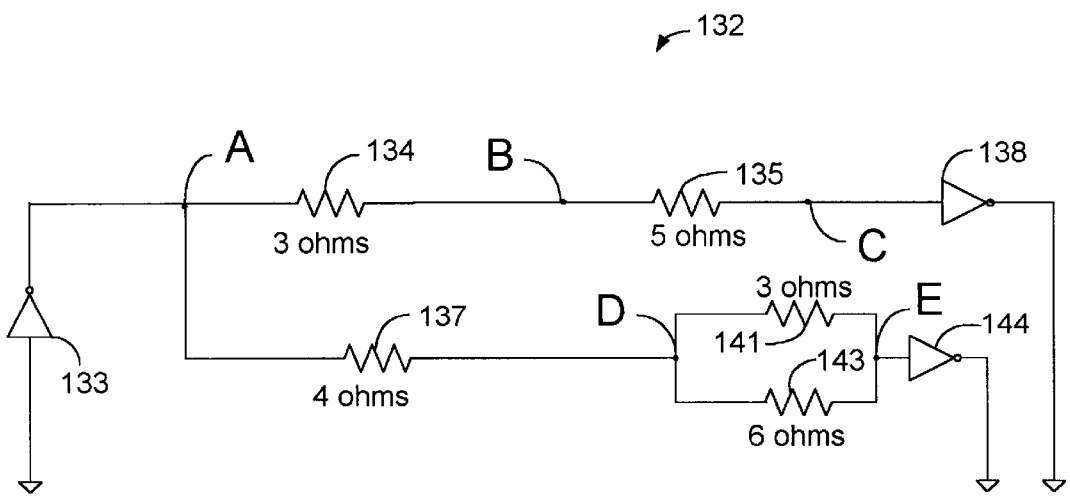
FIG. 4 is a schematic block diagram of a circuit comprising a driver and a plurality of receivers.

FIG. 4 is a schematic block diagram of a circuit 132 for which the effective wire resistance will be calculated using the preferred method of the present invention in order to exemplify the method of the present invention. However, those skilled in the art will understand that the present invention is not limited with respect to the type of circuit on which the method of the present invention may be performed. Those skilled in the art will also understand that modifications to the method of the present invention may be made which are within the scope of the present invention.

The circuit 132 shown in FIG. 4 for exemplary purposes comprises a plurality of receiver gates 138 and 144 and a single driver gate 133. Each of the gates 133, 138 and 144 is comprised of a plurality of FETs (not shown), as will be understood by those skilled in the art. The parasitic resistances contained in the circuit 132 are represented as descrete resistors 134, 135, 137, 141 and 143. These parasitic resistances are obtained by an RC extraction program and are contained in the netlist 16 provided to the static timing analyzer 10. The static timing analyzer 10 passes the netlist 16 to the rules checker 100 of the present invention.

The circuit 132 comprises two paths from the driver 133 to the receivers 138 and 144. In order for the rules checker 100 of the present invention to calculate the effective wire resistance at one of the receiver nodes C or E, the rules checker 100 ensures that it only takes into account the parasitic resistances contained in the path that leads from the driver 133 to the receiver node being evaluated. For example, if the rules checker 100 is determining the effective wire resistance at node C, the rules checker 100 will not take into account the parasitic resistances in the path leading from node A to receiver 144. Similarly, if the rules checker 100 is determining the effective wire resistance at node E, the rules checker 100 will not take into account the parasitic resistances in the path leading from node A to receiver 138. Therefore, the rules checker 100 determines when it is traversing a path which does not lead to the receiver node being evaluated so that it will not take into account parasitic resistances along that path. Paths which do not lead to the receiver node under investigation will be referred to hereinafter as "false" paths. The manner in which the rules checker 100 identifies false paths will be discussed in detail below with reference to FIGS. 5 and 6.

In order to calculate the effective wire resistance at a particular receiver node, the rules checker 100 obtains a list of all of the drivers connected to the receiver node. In order to obtain this list, the rules checker 100 analyzes the logical representation of the network contained in the database of the present invention, as discussed above with respect to FIG. 3A, and obtains a list of all of the elements that are channel-connected to the receiver node 149. The rules checker 100 then utilizes the physical representation of the circuit, as discussed above with respect to FIG. 3A, and obtains a list of the resistances connected between the drivers and the receivers. The electrical rules checker 100 then begins at the output node of a driver and traverses paths in the network and recursively adds resistor values together in order to calculate the effective wire resistance at the receiver node. The manner in which this is accomplished will now be discussed in detail with respect to the flowcharts of FIGS. 5 and 6 and with respect to the circuit shown in FIG. 4A.

Assuming the electrical rules checker 100 is evaluating receiver node C to determine the effective wire resistance at receiver node C, the electrical rules checker 100 begins at node A, which is the output node of driver 133, and begins traversing either the path containing resistor 134 or the path containing resistor 137. The manner in which the path to be traversed first is selected is not critical to the present invention and may be random.

Figure 5:
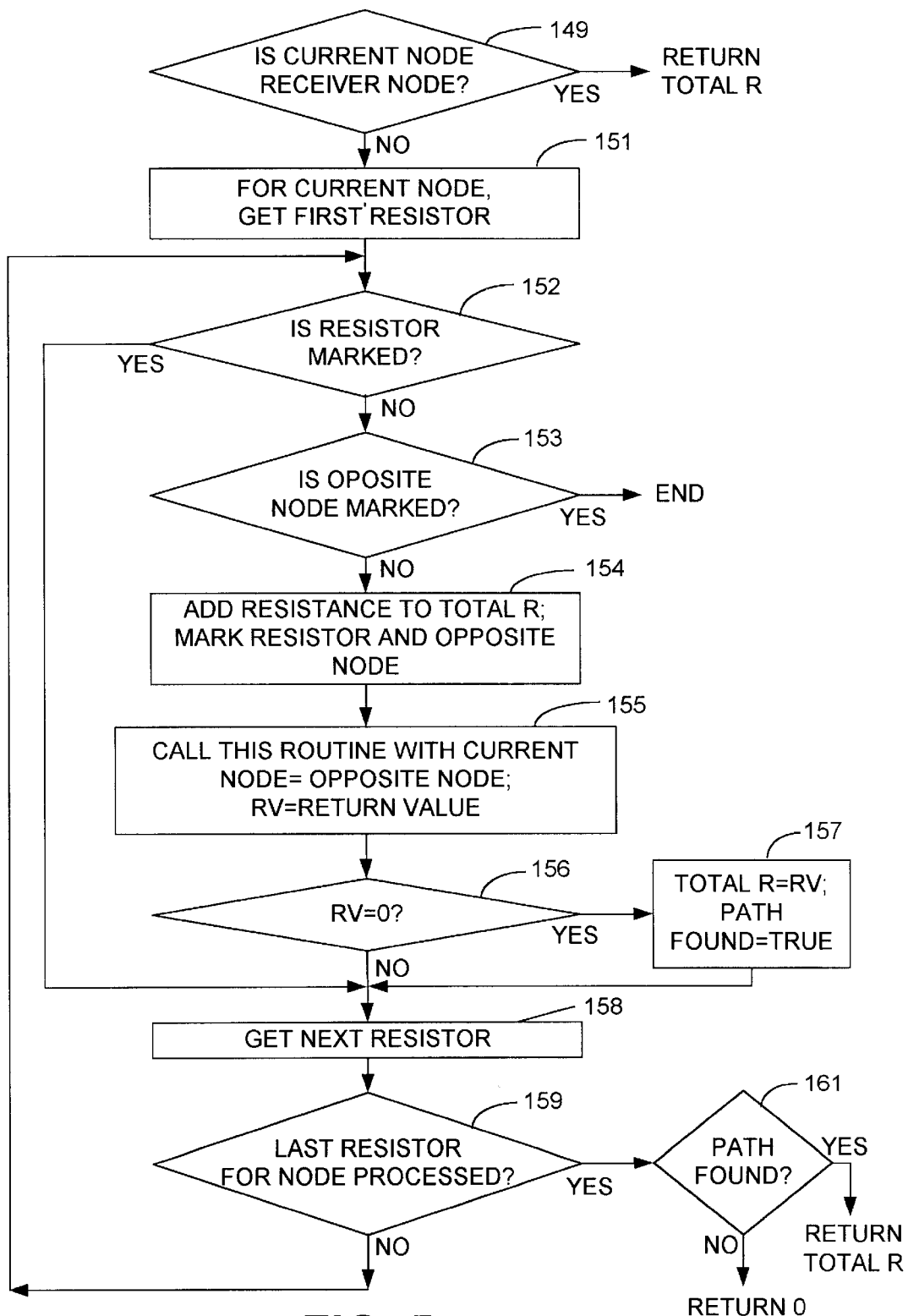
FIG. 5 is a flow chart illustrating the preferred method of the present invention utilized by the rules checker program for calculating the effective wire resistance of a circuit, such as that shown in FIG. 4.

When the routine shown in FIG. 5 is first called, all of the variables used by the routine are initialized. Assuming the electrical rules checker 100 begins with the path containing resistor 137, the electrical rules checker 100 determines at block 149 whether or not the current node is the receiver node C. If so, the routine is complete and the value of the variable TOTAL R, which corresponds to the effective wire resistance, is returned to the rules checker 100. If not, the process proceeds to block 151. Since the current node is receiver node A, the process proceeds to block 151 and the first resistor connected to node A is obtained. Having obtaining resistor 137, the electrical rules checker 100 determines at block 152 whether or not this resistor has already been marked. Since resistor 137 has not previously been encountered, it will not previously have been marked and the process will proceed to block 153.

At block 153 a determination is made as to whether or not the opposite node across resistor 137, node D, has previously been marked. Since node D has not previously been marked, since this is the first time it has been encountered in the routine, the process proceeds to block 154. At block 154, the value of resistor 137 is added to the variable "TOTAL R". Therefore, the variable TOTAL R will be assigned a value of 4. Resistor 137 and node D will then be marked. The process will then proceed to block 155.

At block 155, the routine of FIG. 5 is called and the node identified by CURRENT NODE, which is node A, is pushed onto a stack in a memory device (not shown) and the variable CURRENT NODE is assigned the opposite node, which is node D. A variable "RV", which denotes "returned value", has a value which is assigned to it whenever the routine shown in FIG. 5 returns to the call represented by block 155 from block 161. In this example, the routine has not yet returned from block 161. Therefore, the value of RV will be 0. This variable is used by the rules checker 100 to determine whether or not it is traversing a false path. The process only proceeds from block 155 to block 156 when the process returns from block 161, as described below in more detail.

When the routine of FIG. 5 is called at block 155, the process proceeds to block 149 with the variable CURRENT NODE set to node D Therefore, at this point in the routine, node A has been pushed onto the stack along with other program state, such as the current resistor 137. When the process proceeds to block 149, a determination is made by the electrical rules checker 100 as to whether or not the current node, node D, is the receiver node. Since node D is not the receiver node, the process proceeds to block 151 where the first resistor attached to node D is obtained by the electrical rules checker 100. If the electrical rules checker 100 obtains resistor 137, it will determine at block 152 that resistor 137 has previously been marked. Therefore, the electrical rules checker proceeds from block 152 to block 158 and the next resistor attached to node D is obtained.

Therefore, the electrical rules checker 100 will obtain either resistor 141 or resistor 143. A determination is made at block 159 as to whether or not the last resistor connected to node D has been processed. Assuming the electrical rules checker obtains resistor 141, a determination will be made at block 159 that the last resistor for node D has not been processed and the process will return to block 152 where a determination is made as to whether or not resistor 141 has previously been marked. Since resistor 141 has not previously been marked, the process will proceed to block 153 where a determination is made as to whether not the opposite node, node E, has previously been marked. Since node E has not previously been marked, the process proceeds to block 154 and the value of resistor 141, which is 3, is added to the variable TOTAL R to give the variable TOTAL R a value of 7. Node E and resistor 141 are then marked and the process proceeds to block 155.

When the process proceeds to block 155, the current node, node D, is pushed onto the stack and the variable CURRENT NODE is assigned the value of the opposite node, which is node E. The variable RV is set equal to return value. Since there is no return value at this point, there is no change in the variable RV. The routine of FIG. 5 is then called and the process proceeds to block 149 where a determination is made as to whether or not node E is the receiver node. Since node E is not the receiver node, the process proceeds to block 151 where the first resistor connected to node E is obtained. Assuming the electrical rules checker 100 obtains resistor 143, when the process proceeds to block 152, a determination will be made that resistor 143 has not previously been marked and the process will proceed to block 153.

At block 153, the electrical rules checker 100 will determine that the opposite node, node D, has previously been marked and the process will end because the electrical rules checker 100 will determine that the current path contains multiple paths. This particular method of the present invention for calculating the effective wire resistance is not intended to be performed in cases where multiple paths are found. In this situation, preferably the routine returns to the output node, node A, of driver 133 and determines whether or not there are more paths to traverse.

Since the path containing nodes D and E does not lead to the receiver node C being evaluated, this path is a false path. Preferably, the electrical rules checker 100 will continue traversing this false path, even after it has determined that the path contains multiple paths, in order to determine whether or not the path actually leads to receiver node C. Therefore, at node E, the electrical rules checker 100 would determine that the path is a false path and return to node A to continue checking other paths to calculate the effective wire resistance in the paths which actually connect to node C. In the interest of brevity and for purposes of simplicity, this step is not shown in the flow chart of FIG. 5.

For purposes of illustration, if only the 3 ohm resistor 141 existed between nodes D and E, then when the process proceeds to block 149 from block 155 with CURRENT NODE set to node E, the routine would obtain resistor 141 at block 151. A determination would then be made at block 152 that this resistor has previously been marked. Therefore, the process would proceed to block 158. A determination would then be made at block 159 that the last resistor for node E has been processed and the process would then proceed to block 161.

At block 161, a determination would be made that the current path is a false path because there are no more resistors to be processed and the current node is not the receiver node. Therefore, the routine will return 0 to block 155. At block 155, the variable RV is set equal to the returned value, which is 0. The last node that was pushed onto the stack is then popped off of the stack and CURRENT NODE is set equal to this node. Since node D was the last node pushed onto the stack, CURRENT NODE will be set to node D. At block 156, a determination will be made that RV is equal to 0 and the process will proceed to block 157. At block 157, the variable TOTAL R is set to the value of RV, which is 0. The variable PATH FOUND is reset to true. The process will then proceed to blocks 158, 159 and 152 and then back to block 158 and on to block 159.

Each time the process reaches block 159, a determination will be made that the current resistor has already been processed for the current node. Therefore, the process will proceed to block 161 where a determination will be made that a path to the receiver node C has not been found. Therefore, the process will return 0 to block 155 and RV will be set equal to 0. The last node that was pushed onto the stack, node A, will then be popped off of the stack.

When the process is at node A, the process will begin traversing the path containing resistor 134. At block 158, the process will obtain resistor 134 and will proceed to block 159 where a determination will be made that the last resistor for node A has not been processed. The process will then return to block 152. A determination is then made at block 152 as to whether or not resistor 134 has previously been marked. Since resistor 134 has not previously been encountered, the process proceeds to block 153 where a determination is made as to whether or not the opposite node, node B, has previously been marked. Since node B has not previously been marked at this point, the process proceeds to block 154 where the value of resistor 134, which is 3, is added to the variable TOTAL R to give it a value of 3. The electrical rules checker 100 marks the opposite node B and resistor 134 and proceeds to block 155.

At block 155, the current node, node A, is pushed onto the stack and the variable CURRENT NODE is set to the opposite node, which is node B. RV is assigned the return value. Since there is no return value at this point, there is no change in the variable RV, i.e., it is 0. The routine shown in FIG. 5 is then called and the process proceeds to block 149 where a determination is made as to whether or not node B is the receiver node. Since node B is not the receiver node, the electrical rules checker 100 obtains the first resistor connected to node B, which is resistor 134. A determination is then made at block 152 that this resistor has already been marked, and the process proceeds to block 158. At block 158, the next resistor connected to node B is obtained, which is resistor 135. A determination is then made at block 159 as to whether or not the last resistor for node B has been processed.

Since resistor 135 has not already been processed, the process proceeds to block 152 where a determination is made as to whether or not resistor 135 has previously been marked. Since resistor 135 has not previously been marked, the electrical rules checker 100 proceeds to block 153 and determines whether or not the opposite node, node C, has previously been marked. Since node C has not previously been marked, the process proceeds to block 154 where the electrical rules checker 100 adds the value of resistor 135 to the value of TOTAL R giving TOTAL R a value of 8. The electrical rules checker 100 then marks resistor 135 and node C and proceeds to block 155.

At block 155, the current node, which is node B, is pushed onto the stack and CURRENT NODE is set to the opposite node, which is node C. The process then calls the routine of FIG. 5 and returns to block 149 where a determination is made as to whether or not node C is the receiver node. Since node C is the receiver node, the routine of FIG. 5 returns the TOTAL R to whatever routine in the electrical rules checker program called the routine of FIG. 5. Therefore, the value of 8 ohms is returned, which is the effective wire resistance at node C.

Figure 6:
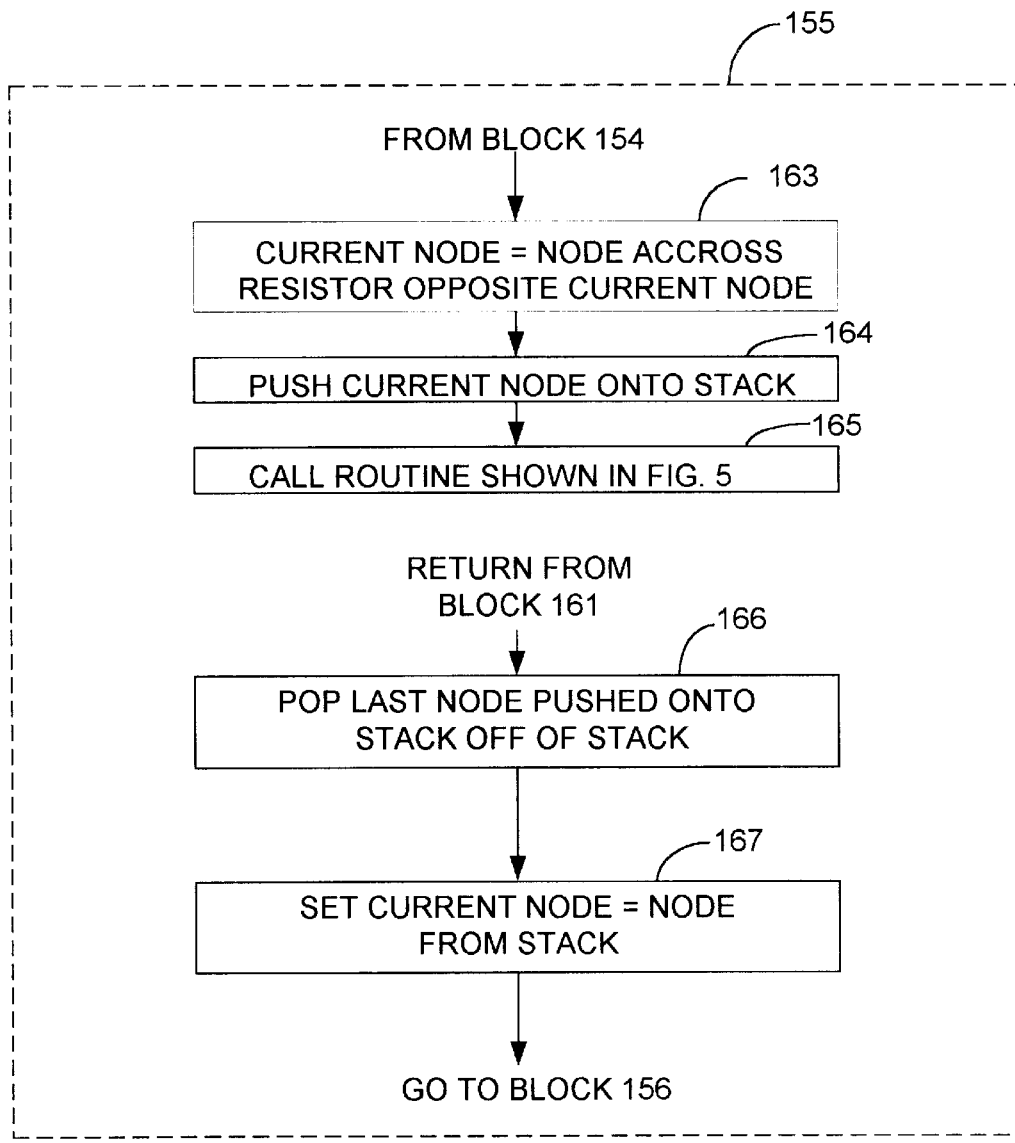
FIG. 6 is a flow chart which provides a detailed illustration of one of the steps contained in the flow chart of FIG. 5.

FIG. 6 is a flow chart illustrating the steps performed in block 155 of the flow chart shown FIG. 5. When the process proceeds from block 154 to block 155, CURRENT NODE is set to the node across the resistor opposite the current node, as indicated by block 163. The current node is pushed onto the stack along with the other program state, as indicated by block 164. The routine represented by the flow chart shown in FIG. 5 is then called, as indicated by block 163.

When the process returns from block 161, the node and the resistor on the top of the stack are popped off of the stack, as indicated by block 166. The process then proceeds to block 167 where the node that was popped off of the stack is assigned to CURRENT NODE. The process then proceeds to block 156 in FIG. 5 where a determination is made as to whether or not RV is equal to 0, as discussed above in detail.

It should be noted that the rules checking task 103 of the present invention can be performed in hardware, software or a combination of both. Although the rules checking task 103 preferably is performed in software in the manner described above, those skilled in the art will understand that these functions can also be implemented solely in hardware, or in a combination of hardware and software.

It should be noted that the foregoing description is not intended to be exhaustive or to limit the invention to the precise forms disclosed. Those skilled in the art will understand that modifications or variations are possible in light of the above teachings, which are within the scope of the present invention. In this regard, the embodiment discussed above was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention.

What is claimed is:

1. An apparatus for determining an effective wire resistance of a network comprised in an integrated circuit, the apparatus comprising:

a computer configured to execute a rules checker program, wherein when the rules checker program is executed by the computer, the rules checker program analyzes information relating to the network to determine an effective wire resistance at a receiver node of a receiver gate of the network, the effective wire resistance being associated with one or more individual parasitic resistances inherent in a conductive path of the network that connects a driver gate of the network to said receiver node, the rules checker program calculating the effective wire resistance by summing the values of the parasitic resistances along the path from the driver gate to the receiver node.

2. The apparatus of claim 1, wherein the rules checker program identifies all driver gates that are connected to the receiver node and all of the parasitic resistances associated with paths that connect the driver gates to the receiver node, the rules checker program traversing a path from one of the driver gates to the receiver node and identifying parasitic resistances along the path, wherein the effective wire resistance is equal to the sum of all of the parasitic resistances along the path being traversed.

3. The apparatus of claim 2, wherein the rules checker program uses an RC extraction program to analyze a netlist to obtain the parasitic resistances, the RC extraction program extracting the parasitic resistances from the netlist and providing the parasitic resistances to the rules checker program.

4. The apparatus of claim 3, wherein the rules checker program identifies the driver gates by analyzing a list of elements that are channel-connected to the receiver node and by looking at direction information relating to each of the channel-connected elements.

5. The apparatus of claim 4, wherein the rules checker program processes each node of the network and identifies parasitic resistances connected to the nodes, wherein when the rules checker program encounters a parasitic resistance connected to a node, the rules checker program determines whether or not the encountered parasitic resistance has previously been marked, wherein if the rules checker program determines that the encountered parasitic resistance has not previously been marked, the rules checker program marks the encountered parasitic resistance and the node being processed, the rules checker program adding the value of the encountered parasitic resistance to a value of a TOTAL RESISTANCE variable.

6. The apparatus of claim 5, wherein if the rules checker program determines that the encountered parasitic resistance has previously been marked, the rules checker program does not mark the parasitic resistance and does not add the value of the parasitic resistance to the value of the TOTAL RESISTANCE variable.

7. The apparatus of claim 6, wherein the rules checker program determines whether or not a node connected to the encountered parasitic resistance and opposite the node being processed has previously been marked, wherein if the rules checker program determines that encountered parasitic resistance has not previously been marked, and wherein if the rules checker program determines that the node opposite the node being processed has previously been marked, the rules checker program determines that the path being traversed contains multiple paths between the node being processed and the node opposite the node being processed and quits calculating the effective wire resistance.

8. The apparatus of claim 7, wherein once the rules checker program has determined that the node opposite the node being processed has not previously been marked, the rules checker program adds the encountered parasitic resistance to the value of the TOTAL RESISTANCE variable.

9. The apparatus of claim 8, wherein if the rules checker program determines that all of the parasitic resistances along the path being traversed have been summed and added to the value of the TOTAL R variable, and if the rules checker program determines that the node being processed is the receiver node, the rules checker program determines that the value of the TOTAL R variable is equal to the effective wire resistance.

10. A rules checker computer program embodied on a computer-readable medium, the program calculating an effective wire resistance at a receiver node of a receiver gate comprised in an integrated circuit, the effective wire resistance being associated with a network of the integrated circuit, the network comprising a driver connected by a conductive path to the receiver node, the conductive path having a parasitic resistance associated therewith, the program comprising:

code for traversing the conductive path from an output node of the driver gate to the receiver node of the receiver gate, the code summing parasitic resistances encountered along the path and maintaining a total of the summed parasitic resistances, wherein when the code determines that all of the parasitic resistances between the output node of the driver and the receiver node of the receiver have been summed, the code determines that the total is equal to the effective wire resistance at the receiver node.

11. The computer program of claim 10, wherein the code further comprises:

a first code segment for analyzing parasitic resistances and nodes encountered on the conductive path, the first code segment determining whether a parasitic resistance encountered on the path has previously been marked by the first code segment and whether a node opposite the node being processed has previously been marked by the first code segment, wherein if the first code segment determines that the parasitic resistance encountered and the opposite node have not previously been marked, the first code segment marks the node being processed and the encountered parasitic resistance and adds the value of the encountered parasitic resistance to the total.

12. The computer program of claim 11, wherein the first code segment determines whether or not the path being traversed is a true path by determining whether or not the node being processed on the path is the receiver node, wherein when the first code segment determines that the node being processed is the receiver node, the first code segment determines that the last parasitic resistance along the path has been added to the total and that the total equals the effective wire resistance.

13. A method for determining an effective wire resistance of a network comprised in an integrated circuit, the method comprising the steps of:

executing a rules checker program in a computer, wherein when the rules checker program is executed by the computer, the rules checker program analyzes information relating to the network to determine an effective wire resistance at a receiver node of a receiver gate of the network, the effective wire resistance being associated with one or more individual parasitic resistances along a conductive path of the network that connects a driver gate of the network to the receiver node, the effective wire resistance corresponding to a total of the values of all of the parasitic resistances along the path summed together.

14. The method of claim 13, wherein, during the executing step, the rules checker program uses an RC extraction program to analyze a netlist to obtain the parasitic resistances, the RC extraction program extracting the parasitic resistances from the netlist and providing the parasitic resistances to the rules checker program.

15. The method of claim 14, wherein, during the executing step, the rules checker program identifies the driver gates by analyzing a list of elements that are channel-connected to the receiver node and by looking at direction information relating to each of the channel-connected elements.

16. The method of claim 15, wherein, during the executing step, the rules checker program processes each node of the network and identifies parasitic resistances connected to the nodes, wherein when the rules checker program encounters a parasitic resistance connected to a node, the rules checker program determines whether or not the encountered parasitic resistance has previously been marked, wherein if the rules checker program determines that the encountered parasitic resistance has not previously been marked, the rules checker program marks the encountered parasitic resistance and the node being processed, the rules checker program adding the value of the encountered parasitic resistance to a value of a TOTAL RESISTANCE variable.

17. The method of claim 16, wherein, during the executing step, if the rules checker program determines that the encountered parasitic resistance has previously been marked, the rules checker program does not mark the parasitic resistance and does not add the value of the parasitic resistance to the value of the TOTAL RESISTANCE variable.

18. The method of claim 17, wherein, during the executing step, the rules checker program determines whether or not a node connected to the encountered parasitic resistance and opposite the node being processed has previously been marked, wherein if the rules checker program determines that encountered parasitic resistance has not previously been marked, and wherein if the rules checker program determines that the node opposite the node being processed has previously been marked, the rules checker program determines that the path being traversed contains multiple paths between the node being processed and the node opposite the node being processed and quits calculating the effective wire resistance.

19. The method of claim 18, wherein, during the executing step, once the rules checker program has determined that the node opposite the node being processed has not previously been marked, the rules checker program adds the encountered parasitic resistance to the value of the TOTAL RESISTANCE variable.

20. The method of claim 19, wherein, during the executing step, if the rules checker program determines that all of the parasitic resistances along the path being traversed have been summed and added to the value of the TOTAL R variable, and if the rules checker program determines that the node being processed is the receiver node, the rules checker program determines that the value of the TOTAL R variable is equal to the effective wire resistance.

21. An apparatus for determining an effective wire resistance of a network comprised in an integrated circuit, the apparatus comprising:

means for analyzing information relating to the network to determine an effective wire resistance at a receiver node of a receiver gate of the network, the effective wire resistance being associated with one or more individual parasitic resistances inherent in a conductive path of the network that connects a driver gate of the network to said receiver node, said means calculating the effective wire resistance by summing the values of the parasitic resistances along the path from the driver gate to the receiver node.

\* \* \* \* \*

UNITED STATES PATENT AND TRADEMARK OFFICE
CERTIFICATE OF CORRECTION

| | | |
|---|---|---|
| PATENT NO. | : 6,550,041 B1 | Page 1 of 1 |
| DATED | : April 15, 2003 | |
| INVENTOR(S) | : John G. McBride | |

Figure 7:
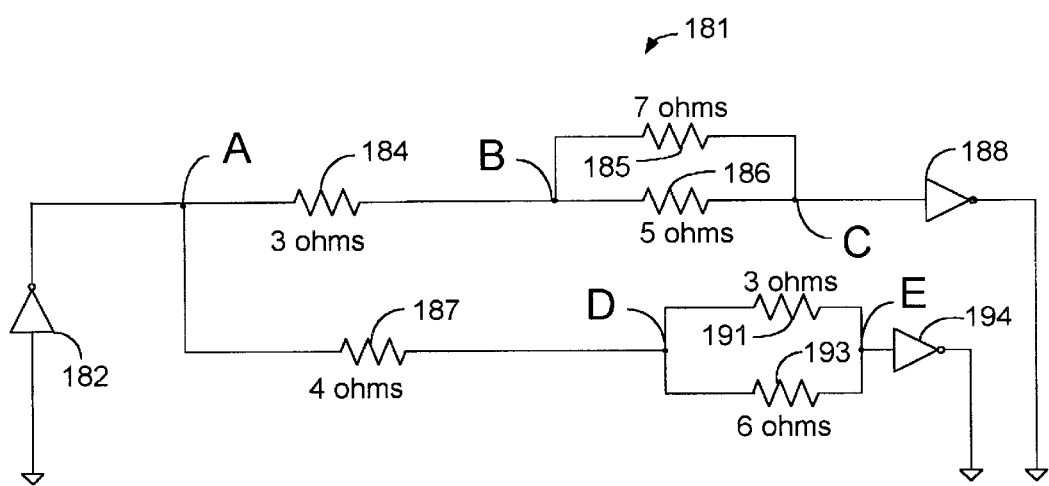

It is certified that error appears in the above-identified patent and that said Letters Patent is hereby corrected as shown below:

<u>Column 4,</u>
Line 48, after "5." begin a new paragraph and insert -- FIG. 7 is a schematic block diagram of a circuit comprising a driver and plurality of receivers, similar to FIG. 4. --

Signed and Sealed this

Twelfth Day of October, 2004

JON W. DUDAS
*Director of the United States Patent and Trademark Office*

UNITED STATES PATENT AND TRADEMARK OFFICE
CERTIFICATE OF CORRECTION

PATENT NO. : 6,550,041 B1
DATED : April 15, 2003
INVENTOR(S) : John G. McBride

It is certified that error appears in the above-identified patent and that said Letters Patent is hereby corrected as shown below:

Column 14,
Line 10, after "software." insert --FIG. 7 is a schematic block diagram of a circuit 181 for which the effective wire resistance may be calculated using a method of an embodiment of the invention. The schematic of FIG. 7 is a substantial duplicate of the schematic shown in FIG. 4, except that FIG. 7 includes a resistor 185 in parallel with resistor 186. Otherwise, resistors 184, 186, 187, 191, and 193 of FIG. 7 correspond to resistors 134, 135, 137, 141, and 143 of FIG. 4. Likewise gates 182, 188, and 194 of FIG. 7 correspond to gates 133, 138, and 144 of FIG. 4. The structure and operation of the components of FIG. 7 are substantially the same as the structure and operation of the components described in FIG. 4 above.--

Signed and Sealed this

Twenty-first Day of December, 2004

JON W. DUDAS
*Director of the United States Patent and Trademark Office*